United States Patent [19]

Miyao et al.

[11] Patent Number: 5,066,355
[45] Date of Patent: Nov. 19, 1991

[54] METHOD OF PRODUCING HETERO STRUCTURE

[75] Inventors: Masanobu Miyao; Kiyokazu Nakagawa, both of Saitama; Kiyonori Ohyu, Tokyo; Eiichi Murakami, Tokyo; Takashi Ohshima, Tokyo, all of Japan

[73] Assignee: Agency of Industrial Science and Technology, Tokyo, Japan

[21] Appl. No.: 438,290

[22] Filed: Nov. 16, 1989

[30] Foreign Application Priority Data

Nov. 19, 1988 [JP] Japan .................... 63-291101

[51] Int. Cl.$^5$ .................... C30B 23/02; C30B 25/14
[52] U.S. Cl. .................... 156/612; 156/610; 156/611; 156/DIG. 103; 437/11; 437/12; 437/126
[58] Field of Search ..... 156/610, 611, 612, DIG. 103; 437/11, 12, 126, 132

[56] References Cited

U.S. PATENT DOCUMENTS

| | | | |
|---|---|---|---|
| 3,530,011 | 9/1970 | Suzuki et al. | 156/610 |
| 3,929,527 | 12/1975 | Chang et al. | 156/610 |
| 3,963,538 | 6/1976 | Broadie et al. | 156/610 |
| 4,030,949 | 6/1977 | Horikoshi et al. | 156/612 |
| 4,088,515 | 5/1978 | Blakeslee et al. | 156/610 |
| 4,472,492 | 9/1984 | Kanbe et al. | 204/192.26 |
| 4,517,047 | 5/1985 | Chang et al. | 156/610 |
| 4,575,924 | 3/1986 | Reed et al. | 156/612 |
| 4,578,127 | 3/1986 | Gossard et al. | 156/672 |
| 4,870,032 | 9/1989 | Johnston et al. | 156/DIG. 103 |
| 4,918,031 | 4/1990 | Flamm et al. | 204/192.25 |

OTHER PUBLICATIONS

Japanese Journal of Applied Physics, Part 1, vol. 27, No. 8, pp. 1458-1463; T. P. Humphreys et al.: "Growth of GaAs on High Temperature Hydrogen Pretreated (100) Si Substrates by Molecular Beam Epitaxy".

Conference Record of the 10th IEEE Photovoltaic Specialists Conference, New Orleans, La., May 4-8, 1987, pp. 1516-1517; C. E. Dube et al.: "Hydrogen Passivation of Heteroepitaxial GaAs on Si".

Applied Physics Letters, vol. 51, No. 7, Aug. 17, 1987, New York, N.Y., pp. 496-498; S. J. Pearton et al.: "Hydrogenation of GaAs on Si: Effects of Diode Reverse Leakage Current".

Applied Physics Letters, vol. 51, No. 13, Sep. 28, 1987, New York, N.Y., pp. 1013-1015; N. Chand et al.: "Electrical Activity of Defects in Molecular Beam Epitaxially Grown GaAs on Si and Its Reduction by Rapid Thermal Annealing".

Primary Examiner—Robert Kunemund
Attorney, Agent, or Firm—Pennie & Edmonds

[57] ABSTRACT

A method of producing a hetero structure, including the steps of depositing hydrogen atoms or halogen atoms onto a surface of a first single crystal layer formed of semiconductor or metal silicide, and forming a second single crystal layer on the first single crystal layer by hetero epitaxial growth, the second single crystal layer being formed of semiconductor or metal silicide different from the material of the first single crystal layer, wherein both of the steps are continuously conducted without taking the hetero structure out of a producing device. Further, the number of the hydrogen atoms or the halogen atoms to be deposited is equal to or in the range of ±50% with reference to the number of dangling bonds existing in a hetero interface between the first single crystal layer and the second single crystal layer, so that the lattice defects in the hetero interface can be reduced.

7 Claims, 3 Drawing Sheets

METHOD OF PRODUCING HETERO STRUCTURE

BACKGROUND OF THE INVENTION

The present invention relates to a method of producing a single crystal layer formed of semiconductor or metal silicide, and more particularly to a method of producing a hetero structure suitable for production of a semiconductor device having a hetero-structure.

Conventionally, a method of producing a single crystal layer having a hetero-structure has been discussed in Applied Physics, Vol. 55, No. 8 (1986), pp. 791-794.

In this prior art, there has been proposed a hetero epitaxial process as a method of forming any semiconductors other than Si on a silicon (Si) single crystal substrate.

However, since Si and the semiconductor different from Si have different lattice constants, there remain many defects in a hetero interface between Si and the different semiconductor after hetero epitaxial growth.

SUMMARY OF THE INVENTION

It is an object of the present invention to provide a method of producing a hetero structure which eliminates these defects and has a high-quality hetero interface.

According to the present invention, there is provided a method of producing a hetero structure, comprising the steps of depositing hydrogen atoms or halogen atoms onto a surface of a first single crystal layer formed of semiconductor or metal silicide, and forming a second single crystal layer on said first single crystal layer by hetero epitaxial growth, said second single crystal layer being formed of semiconductor or metal silicide different from the material of said first single crystal layer, wherein both of said steps are continuously conducted without taking said hetero structure out of a producing device.

The first and second single crystal layers are preferably formed of semiconductor single crystal materials such as Si, GaAs or InP, or metal silicide single crystal materials such as $NiSi_2$ or $CoSi_2$. The combination of the materials for the first and second single crystal layers is arbitrary. However, if the lattice constants of the materials for the first and second single crystal layers are largely different from each other, the defects tend to be generated in the hetero interface. Therefore, a difference in the lattice constants between both the materials is preferably within 20%, and more preferably within 10%. In this respect, the above-mentioned examples of the materials are preferable.

The deposition of the hydrogen atoms or the halogen atoms may be conducted by spraying the atoms from a nozzle onto a sample (the first single crystal layer) retained in an ultra-high vacuum, for example. In this case, a temperature of the sample is set to preferably about 650° C. or less, and a pressure is set to preferably $10^{-7}$ to $10^{-8}$ Torr. More details of the deposition method will be hereinafter described in connection with the description of the preferred embodiment.

Further, the first single crystal layer may be formed on a predetermined substrate. Alternatively, in the case of using a Si single crystal substrate as the substrate, the substrate itself may be employed for the first single crystal layer.

The hydrogen atoms or the halogen atoms deposited on the first single crystal layer function to terminate dangling bonds to be caused by lattice unconformity in the hetero interface between the first and second single crystal layers, thereby reducing the defects in the hetero interface. It is preferable that the number of the hydrogen atoms or the halogen atoms to be deposited is in the range of ±50% with reference to the number of the dangling bonds, so as to terminate the dangling bonds. More preferably, the number of the hydrogen atoms or the halogen atoms is equal to the number of the dangling bonds.

The number of the dangling bonds can be easily measured by using an electron spin resonance method, for example.

Other objects and features of the invention will be more fully understood from the following detailed description and appended claims when taken with the accompanying drawings.

DETAILED DESCRIPTION OF THE PREFERRED EMBODIMENT

There will now be described a preferred embodiment of the present invention with reference to the drawings.

Figure 1:
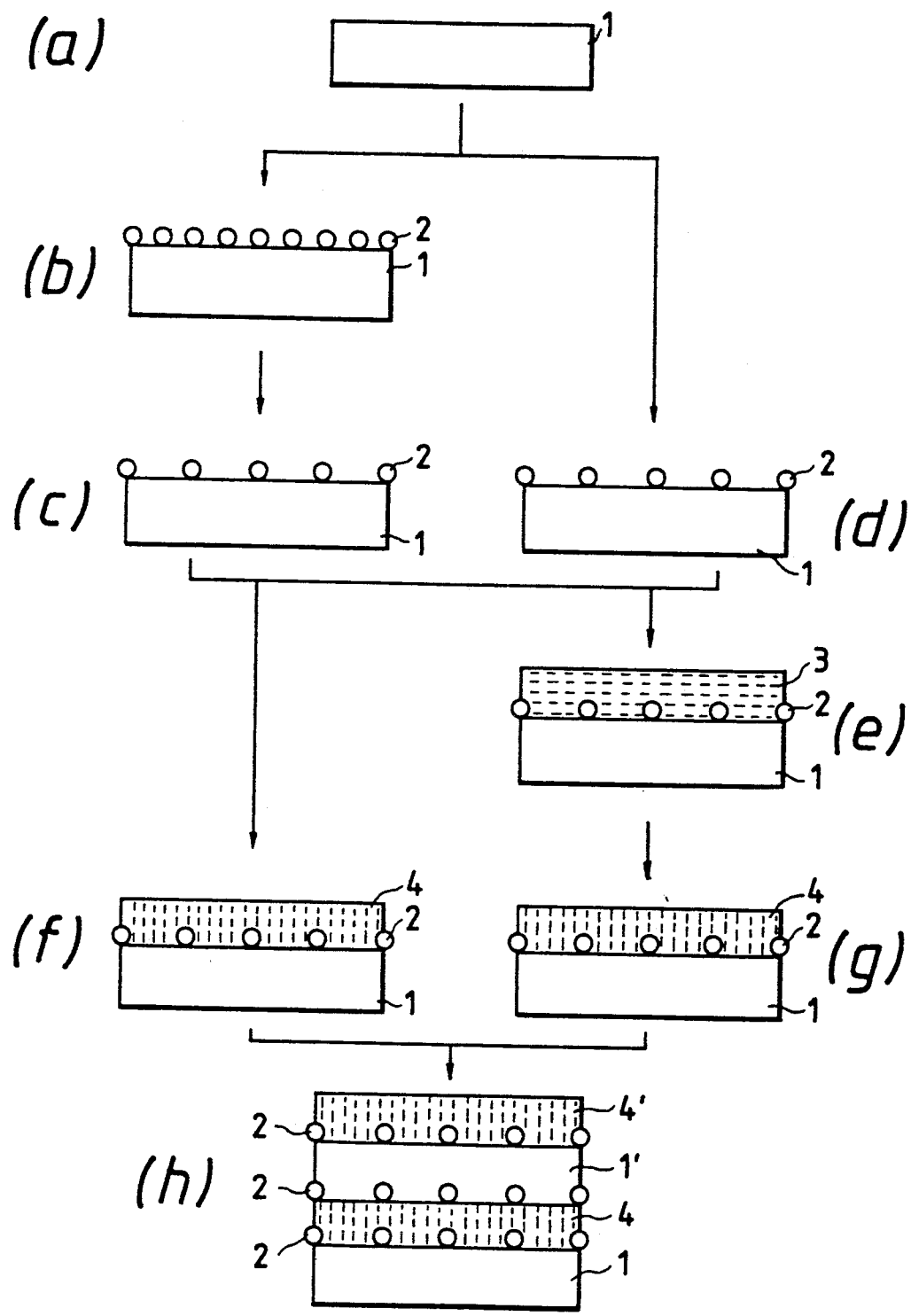
FIG. 1 is a flow diagram of a preferred embodiment of the producing method according to the present invention.

FIG. 1 shows a method of producing a hetero structure in the sequence of steps (a) to (h). The steps (a) to (d) are provided for depositing a desired quantity of H atoms or halogen atoms (F, Cl atoms) 2 on a single crystal Si substrate 1 (first single crystal layer). These steps are carried out in an ultra-high vacuum process known as a so-called molecular beam epitaxy (MBE) process. A typical sequence of these steps in case of depositing F atoms will now be described. First, the Si substrate 1 is heated to 900° C. (for about 15 minutes) to clean a surface of the Si substrate (step (a)). Then, the temperature of the Si substrate is lowered to 650° C., and F gas is sprayed from a nozzle. At this time, even if a large quantity of F gas is sprayed, a single layer of the F atoms ($\leq 6 \times 10^{14}/cm^2$ is stably deposited at all times (step (b)) since Si—F bond is stronger than F—F bond. In a temperature range of about 650° C. or less, a second layer or more of the F atoms is evaporated because the F—F bond is cut. However, the first layer of the F atoms remains stable because the Si—F bond is strong. The number of the F atoms deposited on the Si surface can be freely controlled by heating the sample to about 750° C. for hundreds of seconds (step (c)). For example, when the sample is heated at 750° C. for 200 seconds or 500 seconds, the number of the F atoms ($6 \times 10^{14}/cm^2$) is reduced to $6 \times 10^{13}/cm^2$ or $6 \times 10^{12}/cm^2$, respectively.

Naturally, the number of the F atoms to be deposited onto the Si surface may be controlled by controlling a pressure of the F gas to be sprayed from the nozzle. In this case, a desired number of the F atoms can be deposited onto the Si surface in a single step without re-heating of the sample (see (d)). For example when the F gas is sprayed onto the Si substrate at 650° C. under the pressure of $2 \times 10^{-8}$ Torr for 5 seconds or 10 seconds, the number of the F atoms deposited onto the Si substrate is $8 \times 10^{13}/cm^2$ or $2 \times 10^{14}/cm^2$, respectively.

The next step is provided for forming a hetero single crystal thin film (second single crystal layer) on the sample obtained in step (c) or (d). This step is carried out by using a molecular beam epitaxial growth process (step (f)) or a solid phase epitaxial growth process (steps (e) and (g)). These steps will now be described in case of forming GaAs as the second single crystal layer on the Si substrate as the first single crystal layer.

In the case of the molecular beam epitaxial growth process, amorphous GaAs as a buffer layer is first deposited to a thickness of about 20 nm at a substrate temperature of 150°–400° C. Then, the substrate temperature is raised to 700°–750° C., and the molecular beam epitaxial growth is carried out to a thickness of about 300 nm. At this time, since the substrate temperature is high, the amorphous GaAs first formed is monocrystallized, and GaAs secondly growing is also monocrystallized to obtain a single crystal GaAs 4 (see (f)).

On the other hand, while the solid phase epitaxial growth process as shown in the steps (e) and (g) is similar to the molecular beam epitaxial growth process, a relatively thick layer of amorphous GaAs 3 is deposited (step (e)), and is heated to single-crystallize the amorphous GaAs 3 to obtain a single crystal GaAs 4 (step (g)). That is, the step (e) is provided for depositing the amorphous GaAs to a thickness of about 320 nm at a temperature range of 150°–400° C., and the step (g) is provided for single-crystallizing the amorphous GaAs at an annealing temperature of about 700° C. for 30 minutes to 1 hour. Accordingly, the step (g) is especially called a solid phase epitaxial growth process.

Then, the steps (a) to (f) or the steps (a) to (g) are repeated to form a multi-layer hetero structure of GaAs and Si as shown by the step (h). The hetero structure shown in the step (h) has four layers consisting of second GaAs layer 4'/Si layer 1'/first GaAs layer 4/Si substrate.

As mentioned above, the hetero structure in the preferred embodiment is comprised of GaAs/Si, and it is formed by the molecular beam epitaxial growth process or the solid phase epitaxial growth process. However, it is appreciated that the present invention is applicable to a hetero structure composed of any other materials and formed by any other processes.

Further, as mentioned above, the halogen atoms such as F atoms are introduced to the hetero interface during the crystal growth. In another way, after forming the hetero structure composed of GaAs/Si, for example, the halogen atoms such as F atoms may be introduced into the hetero structure by means of ion implantation or the like, so as to terminate the lattice defects. In this case, the F atoms exist in the Si substrate, the hetero interface and the GaAs film with a certain depth distribution. In other words, undue F atoms exist in the Si substrate and the GaAs film. Therefore, this method is inferior to the method shown in FIG. 1 in respect of the effectiveness.

Figure 2:
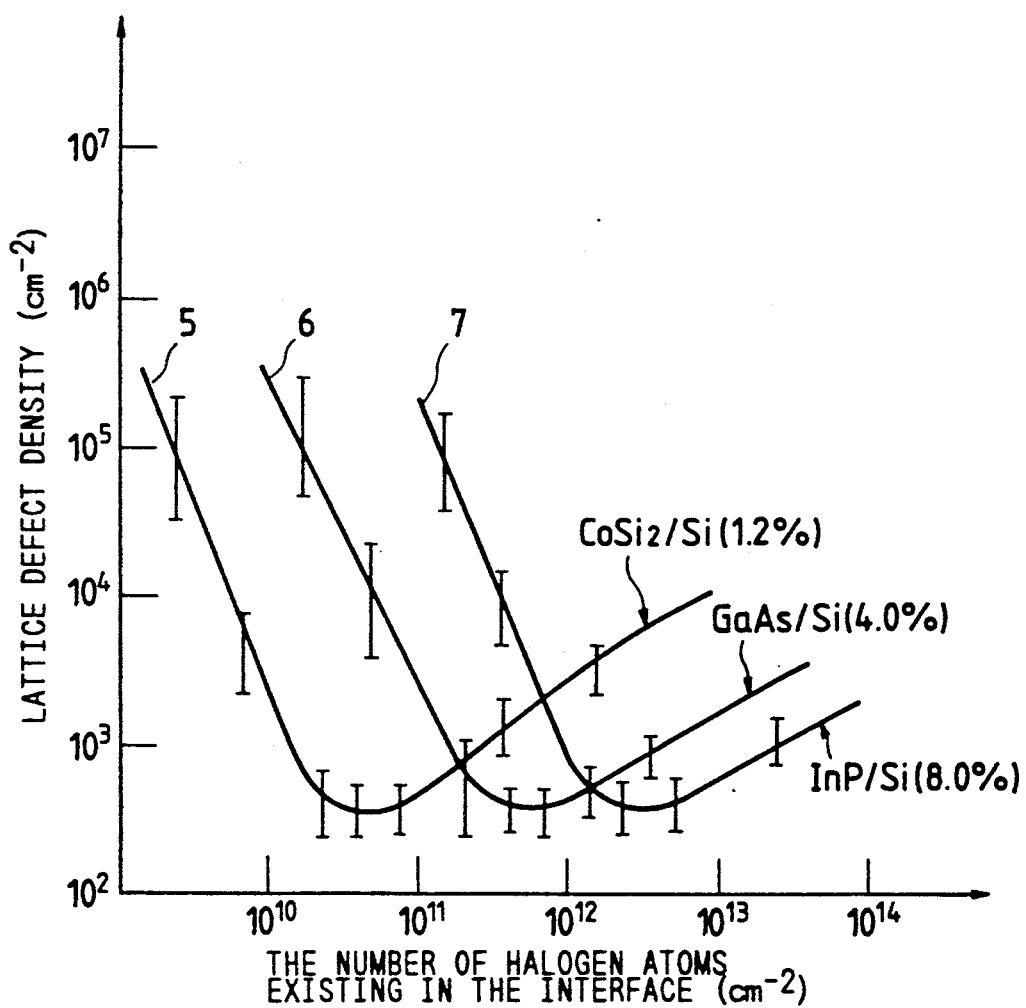
FIGS. 2 and 3 are graphs showing the effect of the present invention.

A lattice defect density in the GaAs/Si crystal formed by the method shown in FIG. 1 was observed by using an electron microscope. FIG. 2 (curve 6) shows the result of evaluation of the lattice defect density. As apparent from FIG. 2, the lattice defect density is reduced by introducing the F atoms, which exhibits the effect of the present invention. In the graph, symbols I denote a range of experimental variation of the lattice defect density. Further, it is understood that there exists an optimum value of the number of the F atoms to be introduced into the hetero interface for minimizing the lattice defect density. While FIG. 2 also shows the other hetero structures of $CoSi_2/Si$ (curve 5) and InP/Si (curve 7), substantially the same effect as GaAs/Si can be obtained. Thus, it is understood from FIG. 2 that the present invention can be applied to a wide variety of hetero materials. Further, it is experimentally confirmed that substantially the same effect as the examples shown in FIG. 2 can be obtained in the case of introducing H atoms and any halogen atoms other than F atoms.

There will now be described the number of the H atoms or the halogen atoms which can especially exhibit the effect of the present invention. In the case of GaAs/Si structure, the lattice constants of GaAs and Si are 5.653 Å and 5.431 Å, respectively. Therefore, there exists lattice unconformity of 4% between GaAs and Si. In other words, there exist dangling bonds of $5.4 \times 10^{11}/cm^2$ in the hetero interface. In the case of the hetero structures of $CoSi_2/Si$ and InP/Si, there exist lattice unconformity of 1.2% and 8.0%, respectively, and there exist dangling bonds of $4.9 \times 10^{10}/cm^2$ and $2.2 \times 10^{12}/cm^2$ in the hetero interfaces, respectively. With reference to the test results shown in FIG. 2, it is appreciated that the numbers of the dangling bonds of these hetero structures are in quantative accord with the numbers of the halogen atoms required for minimizing the lattice defect density. That is, it is appreciated that the condition for most effecting the present invention is to introduce the number of the H atoms or the halogen atoms which can just terminate the dangling bonds existing in the hetero interface.

The above condition can be represented by a general expression in the following manner. Assuming that the lattice constant of a substrate material is represented by d (Å) and the lattice constant of a hetero material to be formed on the substrate is represented by $d(1 \pm x/100)$ (Å) (where x represents a lattice unconformity rate), the number of the dangling bonds existing in the hetero interface can be expressed as follows:

$$[d \times 10^{-8} \times (100/x)]^{-2} \ (cm^{-2})$$

Accordingly, the number (N) of the halogen atoms required for minimizing the lattice defect density can be expressed as follows:

$$N(cm^{-2}) = x^2/(d \times 10^{-6})^2$$

In the case that the substrate material is Si (d = 5.431 Å), the above expression can be rewritten as follows:

$$N(cm^{-2}) = 3.4 \times 10^{10} \cdot x^2$$

Figure 3:
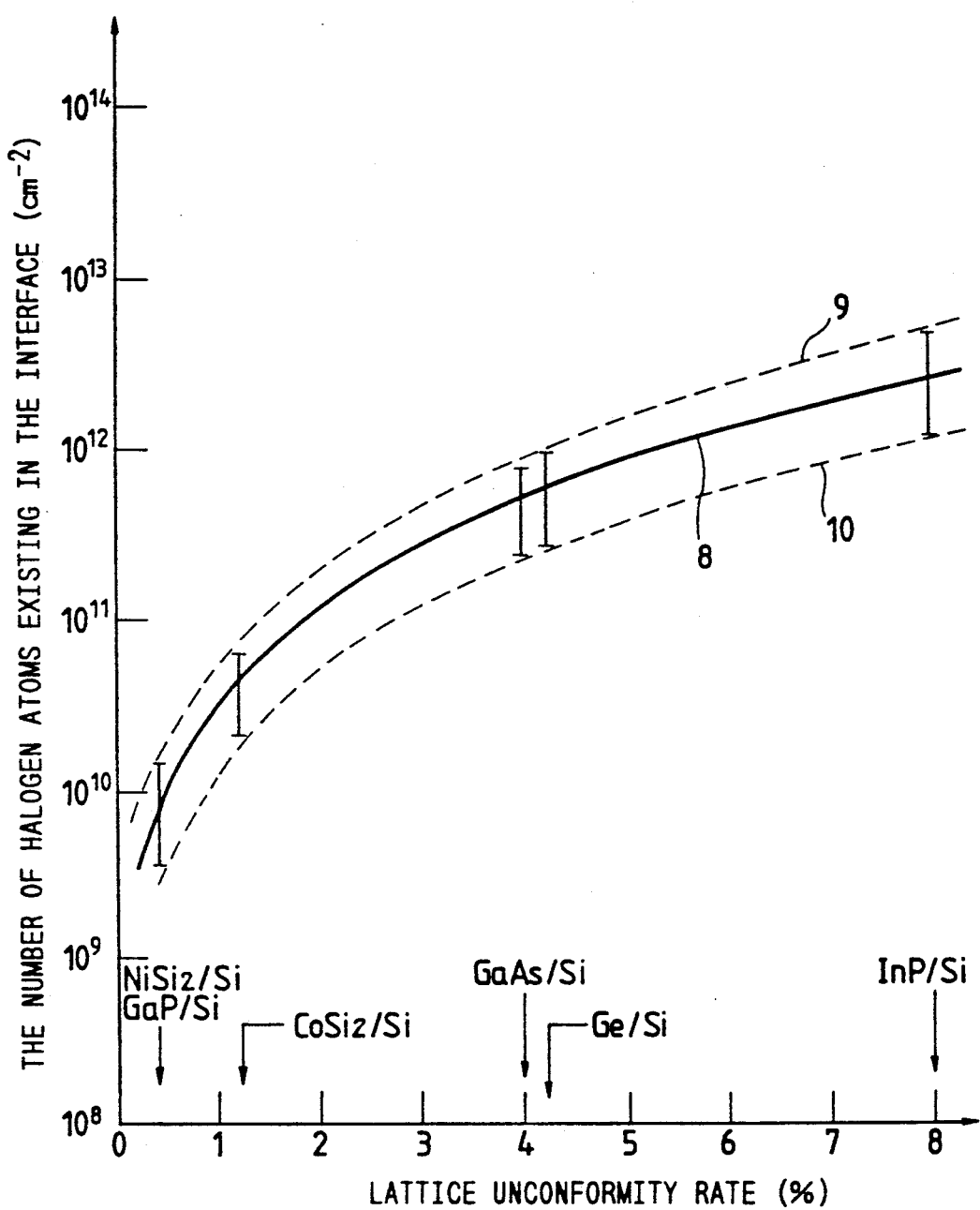

According to the above basic expression, the relationship between the number of the halogen atoms existing in the interface and the lattice unconformity rate can be shown in FIG. 3 applying the present invention to a wide variety of hetero structures ($NiSi_2/Si$, GaP/Si, $CoSi_2/Si$, GaAs/Si, Ge/Si, InP/Si). In the graph shown in FIG. 3, the axis of ordinate denotes the number of the halogen atoms required for minimizing the lattice defect density, while the axis of abscissa denotes the lattice unconformity rate. As apparent from FIG. 3, the above basic expression holds in a wide range of 0.5 – 10% of the lattice unconformity rate, and the present invention is effective to various hetero materials. Particularly, the curve 8 shown in FIG. 3 represents the relationship between the lattice unconformity rate and the number of the halogen atoms required for minimizing the lattice defect density, that is, the expression of $N(cm^{-2}) = 3.4 \times 10^{10} \cdot x^2$, while the curves 9 and 10 represent an upper limit and a lower limit of the number of the halogen atoms capable of effecting the present invention, which upper and lower limits are determined experimentally.

That is to say, considering in-plane variation and experimental error of the lattice defect density (see FIG. 2), a preferable range of the number of the halogen atoms according to the present invention is ±50% with reference to the values to be obtained from the basic expression shown by the curve 8 in FIG. 3.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A method of producing a hetero structure, comprising the steps of depositing hydrogen atoms or halogen atoms onto a surface of a first single crystal layer formed of semiconductor or metal silicide, and forming a second single crystal layer on said first single crystal layer by hetero epitaxial growth, said second single crystal layer being formed of semiconductor or metal silicide having a different lattice constant from the lattice constant of the material forming said first single crystal layer, wherein both of said steps are continuously conducted without taking said hetero structure out of a producing apparatus.

2. The method as defined in claim 1, wherein the number of said hydrogen atoms or said halogen atoms to be deposited is equal to or in the range of ±50% with reference to the number of dangling bonds existing in a hetero interface between said first single crystal layer and said second single crystal layer.

3. The method for producing a hetero structure according to claim 1, wherein said first single crystal layer comprises a semiconductor.

4. The method for producing a hetero structure according to claim 3, wherein said semiconductor is Si.

5. The method for producing a hetero structure according to claim 1, wherein said first single crystal layer comprises metal silicide.

6. The method for producing a hetero structure according to claim 5, wherein said metal silicide is $CoSi_2$.

7. The method for producing a hetero structure according to claim 1, wherein the step of depositing hydrogen atoms or halogen atoms onto the surface of said first single crystal layer comprises spraying hydrogen gas or halogen gas onto the surface of said first single crystal layer.

* * * * *